US006887750B2

(12) United States Patent
Hayashi

(10) Patent No.: US 6,887,750 B2
(45) Date of Patent: May 3, 2005

(54) METHOD FOR MANUFACTURING SEMICONDUCTOR DEVICE INCLUDING IMPLANTING A FIRST IMPURITY THROUGH AN ANTI-OXIDATION MASK

(75) Inventor: Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/382,474

(22) Filed: Mar. 6, 2003

(65) Prior Publication Data

US 2003/0219940 A1 Nov. 27, 2003

(30) Foreign Application Priority Data

Mar. 7, 2002 (JP) ....................................... 2002-061877

(51) Int. Cl.[7] ............................................ H01L 21/8238

(52) U.S. Cl. ....................... 438/199; 438/220; 438/225; 438/227

(58) Field of Search ................................ 438/199, 220, 438/225, 227

(56) References Cited

U.S. PATENT DOCUMENTS 5,708,290 A * 1/1998 Cacciola et al. ............ 257/500

FOREIGN PATENT DOCUMENTS

| | | |
|---|---|---|
| JP | 1-268171 | 10/1989 |
| JP | 7-78881 | 3/1995 |
| JP | 8-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

OTHER PUBLICATIONS

Stanley Wolf Ph.D. and Richard N. Tauber Ph.D. In Silicon Processing for the VLSI Era, vol. 1: Process Technology, Lattice Press, 1986, pp. 323–326.*

* cited by examiner

*Primary Examiner*—Olik Chaudhuri
*Assistant Examiner*—William M. Brewster
(74) *Attorney, Agent, or Firm*—Harness, Dickey & Pierce, P.L.C.

(57) ABSTRACT

A method is provided for manufacturing a semiconductor device having a high breakdown voltage transistor and a low breakdown voltage transistor with different driving voltages provided in a common substrate. The method includes: (a) introducing a first impurity of a second conductivity type by an ion implantation in a specified region of a semiconductor substrate of a first conductivity type; (b) forming an oxide film on a surface of the semiconductor substrate, and diffusing the first impurity by a heat treatment in an atmosphere that does not include oxygen to form a first well of the second conductivity type; and (c) introducing a second impurity of the first conductivity type through the oxide film in a specified region of the first well, and diffusing the second impurity by a heat treatment to form a second well of the first conductivity type.

6 Claims, 9 Drawing Sheets

METHOD FOR MANUFACTURING SEMICONDUCTOR DEVICE INCLUDING IMPLANTING A FIRST IMPURITY THROUGH AN ANTI-OXIDATION MASK

TECHNICAL FIELD

The present invention relates to a method for manufacturing a semiconductor device having a high breakdown voltage transistor and a low breakdown voltage transistor in a common semiconductor substrate.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and operated at high speeds. Wells where high breakdown voltage transistors are formed tend to be made deeper in order to secure the well breakdown voltage. In contrast, wells where low breakdown voltage transistors are formed tend to be made shallower in order to reduce the element size and to achieve higher speeds. For this reason, high breakdown voltage transistors are formed in a chip that is different from a chip for low breakdown voltage transistors, and are conventionally formed as an externally mounted circuit.

In view of the foregoing, one object of the present invention is to provide a method for manufacturing a semiconductor device having a high breakdown voltage transistor and a low breakdown voltage transistor with different driving voltages in a common substrate.

SUMMARY

A method for manufacturing a semiconductor device in accordance with the present invention includes:

(a) introducing a first impurity of a second conductivity type by an ion implantation in a specified region of a semiconductor substrate of a first conductivity type;

(b) forming an oxide film on a surface of the semiconductor substrate, and diffusing the first impurity by a heat treatment in an atmosphere that does not include oxygen to form a first well of the second conductivity type; and (c) introducing a second impurity of the first conductivity type through the oxide film in a specified region of the first well, and diffusing the second impurity by a heat treatment to form a second well of the first conductivity type.

By the manufacturing method in accordance with the present invention, in step (b), because a heat treatment is conducted in an atmosphere that does not include oxygen, but in an inert gas, such as, for example, nitrogen, argon or the like, the semiconductor substrate is not further oxidized. As a result, the oxide film does not become thicker, and its film thickness can be retained. Accordingly, in step (c), the oxide film can also be used as a protective film at the time of an ion implantation, and the number of steps can be reduced.

According to the manufacturing method in accordance with the present invention, the first well where high breakdown voltage transistors are formed and the second well where low breakdown voltage transistors are located are formed in different steps, and therefore the first well and the second well can be independently designed. As a result, the second well can be formed shallower to accommodate size-reduction and increased speeds of low breakdown voltage transistors, and also the area of the well can be reduced, such that the degree of integration can be improved to higher levels.

In accordance with the present invention, in step (a), an anti-oxidation layer having a mask function against oxidation may be selectively formed on the semiconductor substrate, and the first impurity may be introduced in the semiconductor substrate using the anti-oxidation layer as a first mask; a LOCOS layer may be formed by selectively oxidizing a surface of the semiconductor substrate using the anti-oxidation layer as a mask; and after removing the anti-oxidation layer, an impurity of the second conductivity type may be introduced in the semiconductor substrate using the LOCOS layer as a mask to form a third well in the semiconductor substrate adjacent to the first well. According to this process, a first well and a third well which form a twin well can be formed in a self-alignment manner.

In accordance with the present invention, a fourth well of the second conductivity type may be formed within the first well. Further, a low breakdown voltage transistor of the second conductivity type may be formed in the second well; a low breakdown voltage transistor of the first conductivity type may be formed in the fourth well; a high breakdown voltage transistor of the first conductivity type may be formed in the first well; and a high breakdown voltage transistor of the second conductivity type may be formed in the third well.

DETAILED DESCRIPTION

An embodiment of the present invention will be described below with reference to the accompanying drawings.

FIGS. 1–7 schematically show cross-sectional views concerning a method for manufacturing a semiconductor device in accordance with the present embodiment.

Figure 1:
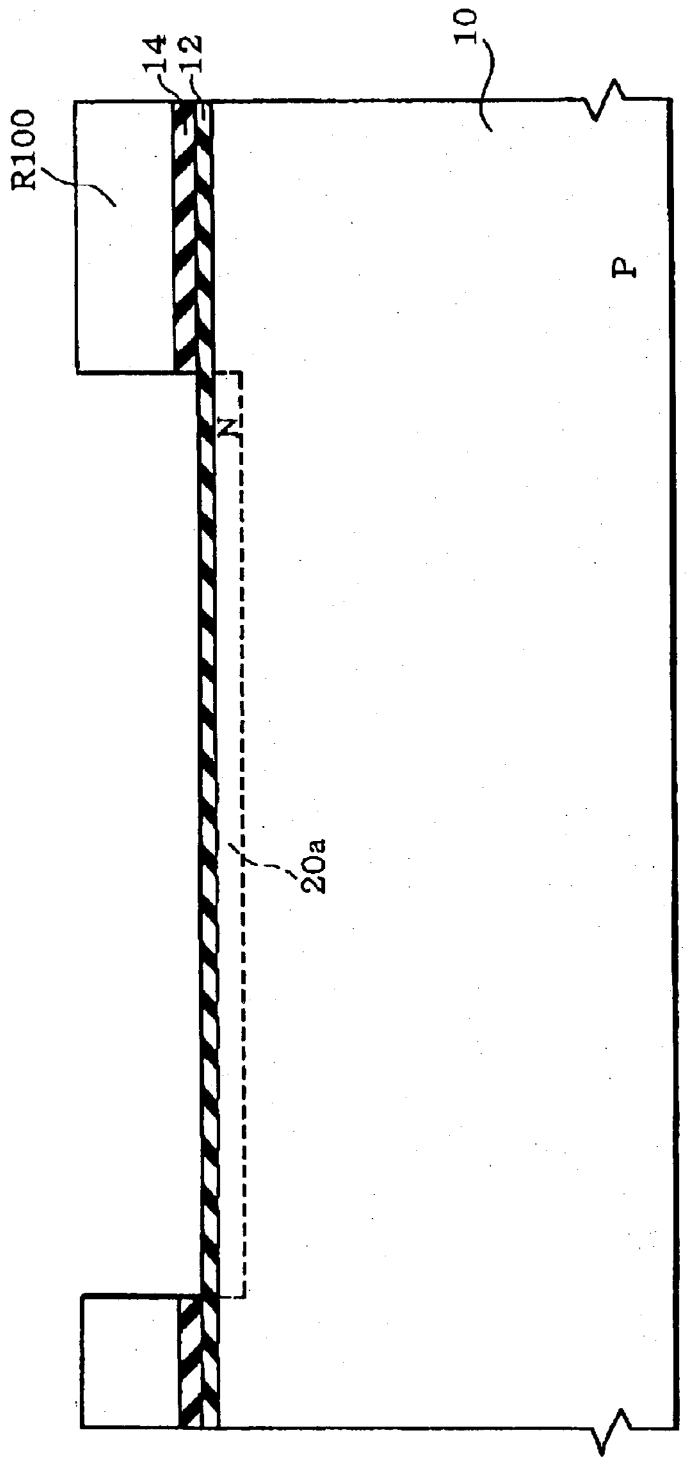
FIG. 1 shows a cross-sectional view indicating a method for manufacturing a semiconductor device in the process order in accordance with an embodiment of the present invention.

(A) As shown in FIG. 1, a semiconductor substrate 10 (e.g., of silicon) of a first conductivity type (P-type in this example) is thermally oxidized to form a silicon oxide layer 12 having a thickness of about 40 nm on a surface of the semiconductor substrate 10. Then, a silicon nitride layer 14 having a thickness of 140–160 nm as an anti-oxidation layer is formed on the silicon oxide layer 12. Then, a resist layer R100 is formed on the silicon nitride layer 14. The resist layer R100 is patterned such that an opening section is formed therein at a position corresponding to an N-type first well. Then, the silicon nitride layer 14 is etched using the resist layer R100 as a mask. Then, for example, phosphorus (first impurity) ions are implanted in the semiconductor substrate 10 using the resist layer R100 and the silicon nitride layer 14 as a mask to form an impurity layer 20*a* of a second conductivity type (N-type in this example). In this instance, the phosphorus ions can be implanted with an acceleration voltage of 120 KeV, for example.

Figure 2:
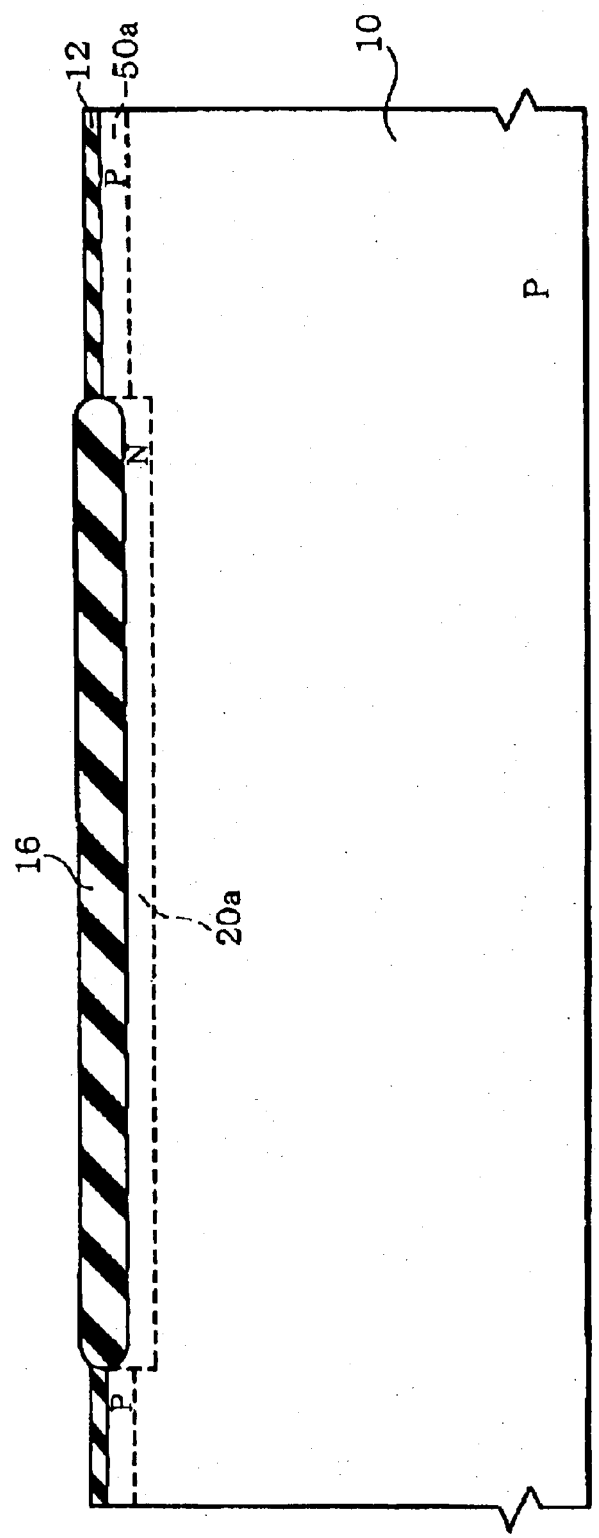
FIG. 2 shows a cross-sectional view indicating the method for manufacturing a semiconductor device in the process order in accordance with the embodiment of the present invention.

(B) As shown in FIGS. 1 and 2, after removing the resist layer R100, the semiconductor substrate 10 is thermally oxidized using the silicon nitride layer 14 as an anti-oxidation mask to form a LOCOS layer 16 having a thickness of about 500 nm on the N-type impurity layer 20*a*. Then, after removing the silicon nitride layer 14, boron ions are implanted in the semiconductor substrate 10 using the LOCOS layer 16 as a mask to form a P-type impurity layer 50*a*. The boron ions may be implanted with an acceleration voltage of 60 KeV, for example.

Figure 3:
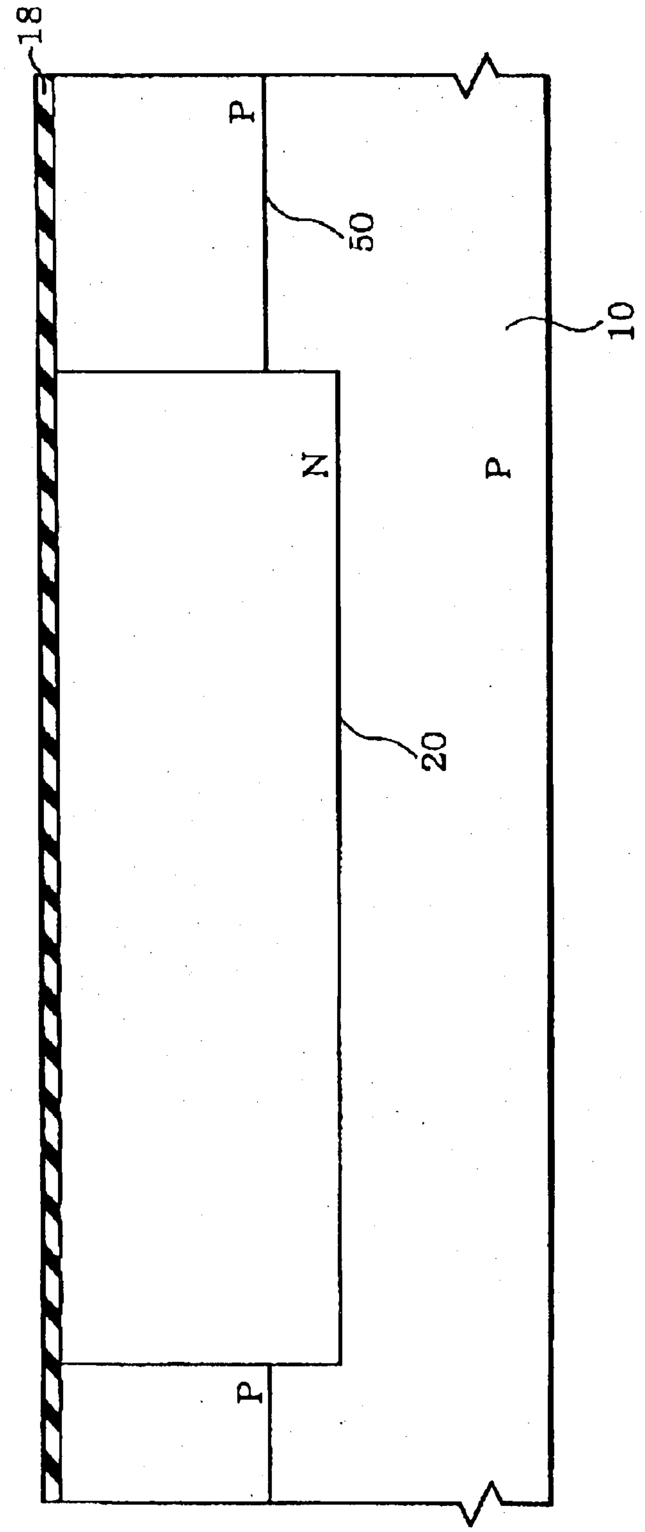
FIG. 3 shows a cross-sectional view indicating the method for manufacturing a semiconductor device in the process order in accordance with the embodiment of the present invention.
Figure 4:
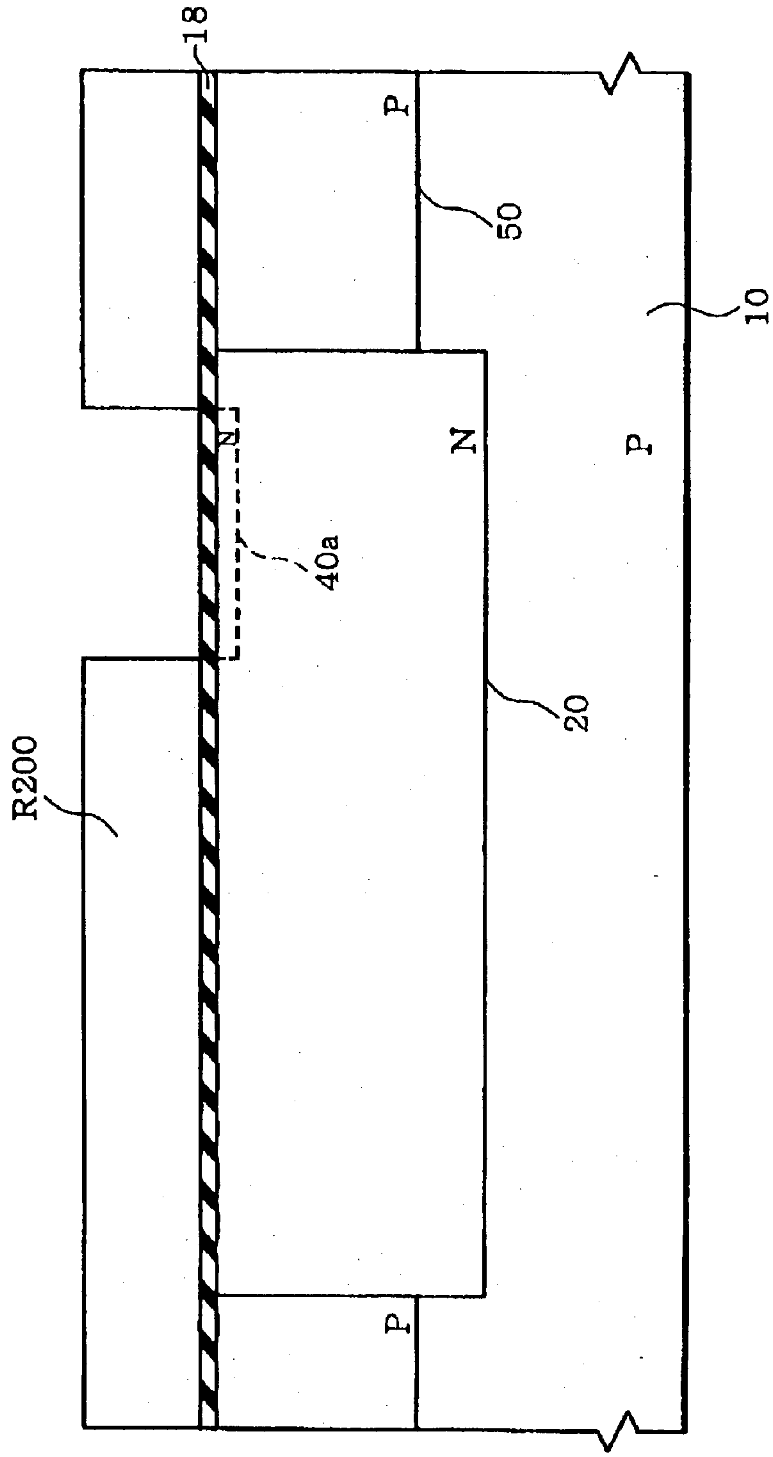
FIG. 4 shows a cross-sectional view indicating the method for manufacturing a semiconductor device in the process order in accordance with the embodiment of the present invention.

(C) As shown in FIGS. 3 and 4, after removing the silicon oxide layer 12 and the LOCOS layer 16, a silicon oxide layer (oxide layer) 18 having a thickness of about 40 nm is formed by thermal oxidation over the semiconductor substrate 10. Then, the impurities in the N-type impurity layer 20*a* and the P-type impurity layer 50*a* are diffused (driven in) by a heat treatment in an atmosphere that does not include oxygen to form an N-type first well 20 and a P-type third well 50 in a self-alignment manner. Since this heat treatment for the diffusion step is conducted in an atmosphere that does not include oxygen, such as, for example, in an inactive gas such as nitrogen or argon, further oxidation of the semiconductor substrate does not occur, and the film thickness of the silicon oxide layer 18 does not change. Accordingly, the silicon oxide layer 18 can be used as a protective film in the next ion implantation step.

This protective film has a function to protect the surface of the semiconductor substrate from damages that may be caused by colliding ions at the time of ion implantation. On the other hand, if the protective film is too thick, the ion implantation efficiency lowers. Accordingly, the protective film composed of the silicon oxide layer may be set to, for example, 40–80 nm in view of the aspects described above.

(D) As shown in FIG. 4, a resist layer R200 having an opening section provided at a position corresponding to a fourth well is formed over the silicon oxide layer 18 that has been formed in step (C). Phosphorus ions are implanted in a specified region of the N-type first well 20 through the silicon oxide layer 18 using the resist layer R200 as a mask to form an N-type impurity layer 40*a*. In this instance, the phosphorus ions can be implanted with an acceleration voltage of 60 KeV, for example.

Figure 5:
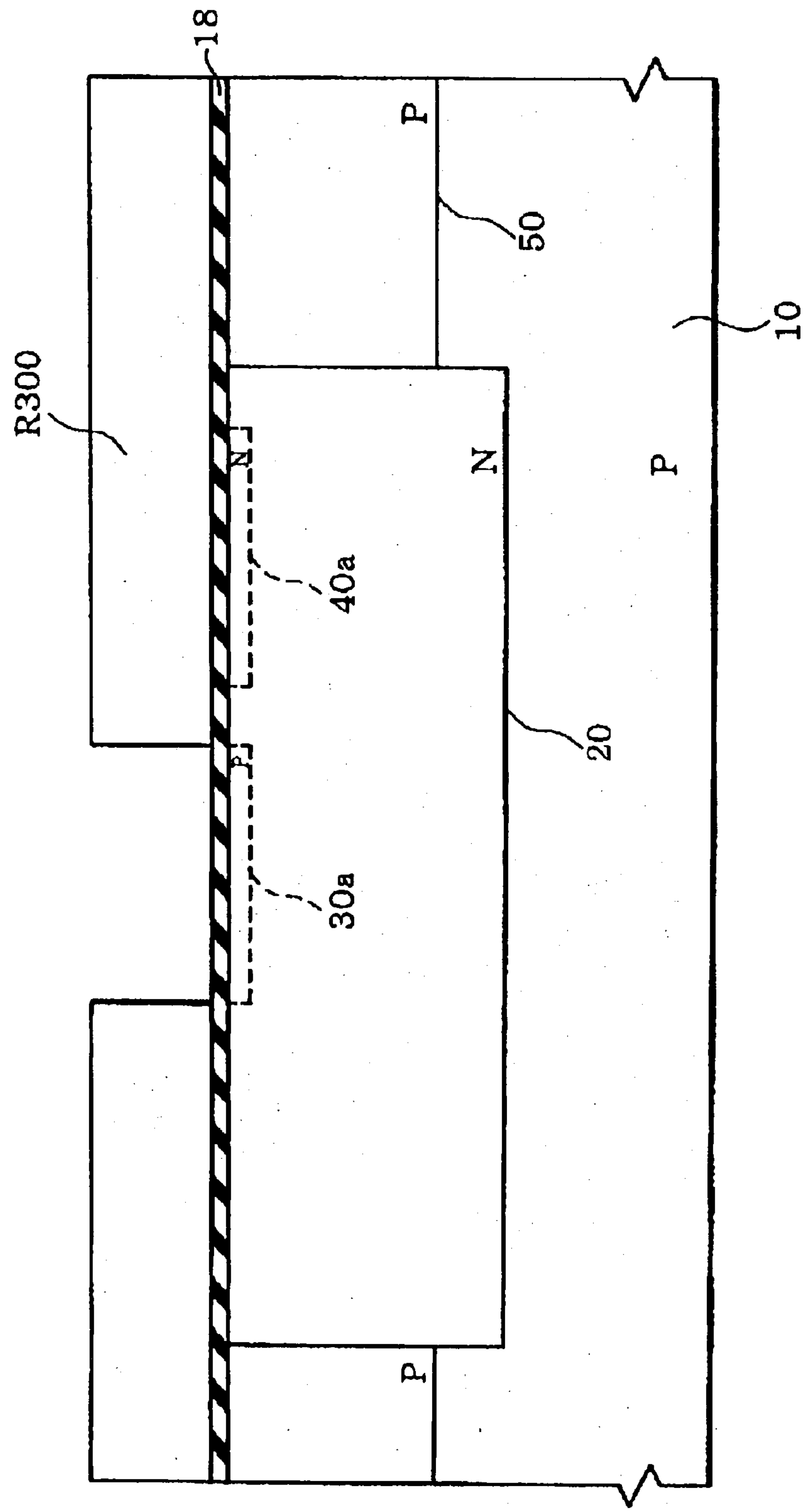
FIG. 5 shows a cross-sectional view indicating the method for manufacturing a semiconductor device in the process order in accordance with the embodiment of the present invention.

(E) As shown in FIG. 5, after removing the resist layer R200, a resist layer R300 having an opening section provided at a position corresponding to a second well is formed over the silicon oxide layer 18. Boron (second impurity) ions are implanted in a specified region of the first well 20 through the silicon oxide layer 18 using the resist layer R300 as a mask to form a P-type impurity layer 30*a*. In this instance, the boron ions can be implanted with an acceleration voltage of 60 KeV, for example. Then, the resist layer R300 is removed.

Figure 6:
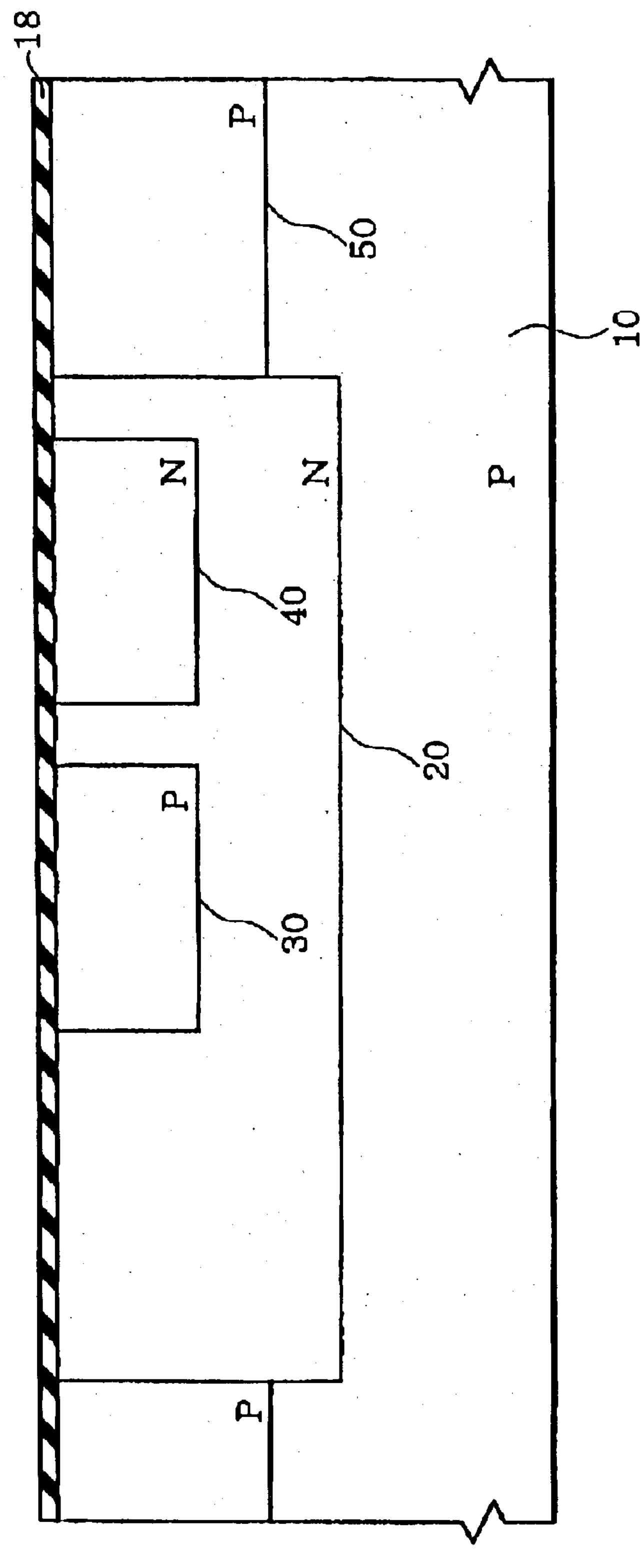
FIG. 6 shows a cross-sectional view indicating the method for manufacturing a semiconductor device in the process order in accordance with the embodiment of the present invention.

(F) As shown in FIG. 6, the impurities in the P-type impurity layer 30*a* and the N-type impurity layer 40*a* are simultaneously diffused (driven in) by a heat treatment to form a P-type second well 30 and an N-type fourth well 40. In this instance, the impurities in the first well 20 and the third well 50 are also simultaneously diffused.

In this manner, the N-type first well 20 and the P-type third well 50 adjacent to the first well 20 are formed in the P-type semiconductor substrate 10. Further, the P-type second well 30 and the N-type fourth well 40 are formed within the first well 20. It is noted that the order of step (D) and step (E) can be reversed if desired.

Figure 7:
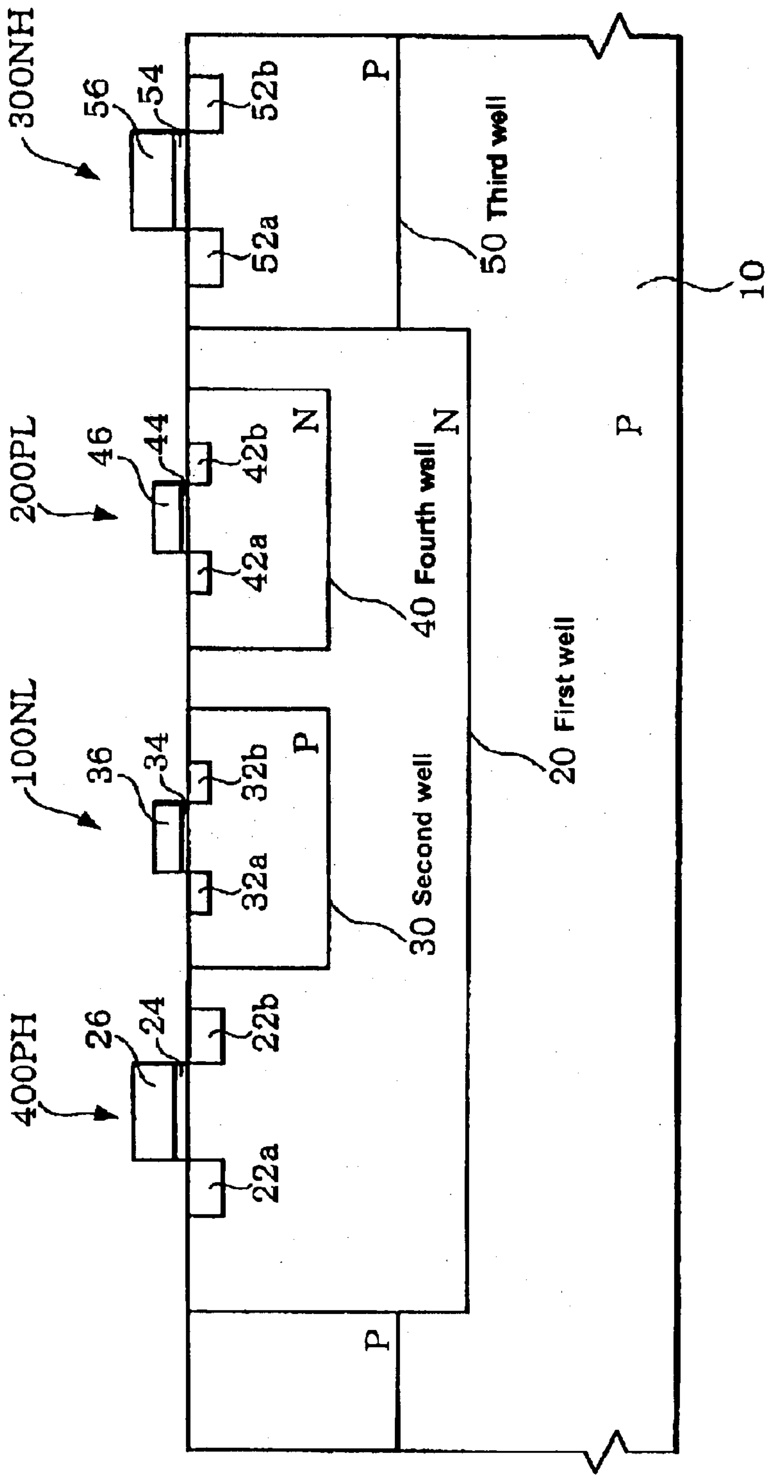
FIG. 7 shows a cross-sectional view indicating the method for manufacturing a semiconductor device in the process order in accordance with the embodiment of the present invention.

(G) As shown in FIG. 7, element isolation dielectric layers (not shown), gate dielectric layers, gate electrodes, source/drain layers and the like are formed by known methods to form specified transistors. More specifically, low breakdown voltage transistors are formed in the second well 30 and the fourth well 40 that are shallower than the first well 20, and high breakdown voltage transistors are formed in the first well 20 and the third well 50.

Even more specifically, an N-channel type low breakdown voltage transistor 100NL is formed in the second well 30. The low breakdown voltage transistor 100NL includes source/drain layers 32*a* and 32*b* composed of N-type impurity layers, a gate dielectric layer 34 and a gate electrode 36.

A P-channel type low breakdown-strength transistor 200PL is formed in the fourth well 40. The low breakdown-strength transistor 200PL includes source/drain layers 42*a* and 42*b* composed of P-type impurity layers, a gate dielectric layer 44 and a gate electrode 46.

An N-channel type high breakdown voltage transistor 300NH is formed in the third well 50. The high breakdown voltage transistor 300NH includes source/drain layers 52*a* and 52*b* composed of N-type impurity layers, a gate dielectric layer 54 and a gate electrode 56.

A P-channel type high breakdown voltage transistor 400PH is formed in the first well 20. The high breakdown voltage transistor 400PH includes source/drain layers 22*a* and 22*b* composed of P-type impurity layers, a gate dielectric layer 24 and a gate electrode 26.

The low breakdown voltage transistors 100NL and 200PL are driven by a driving voltage of, for example, 1.8–5V. The high breakdown voltage transistors 300NH and 400PH are driven by a substantially higher driving voltage as compared to those of the low breakdown voltage transistors 100NL and 200PL, for example, by a driving voltage of 20–60V. A ratio of the breakdown voltages between the low breakdown voltage transistor 100NL, 200PL and the high breakdown voltage transistor 300NH, 400PH, i.e., (a breakdown voltage of a high breakdown voltage transistor)/(a breakdown voltage of a low breakdown voltage transistor) is, for example, 3–60. The "breakdown voltage" generally means a drain breakdown voltage.

In the present embodiment, the structure of each of the wells is determined based on breakdown voltage and threshold value of transistors provided in each well and junction breakdown voltage and punch-through breakdown voltage between the wells.

Impurity concentrations of the wells will now be described. The impurity concentration of the second well 30 and fourth well 40 where low breakdown voltage transistors are formed is set higher than the impurity concentration of the first well 20 and the third well 50 where high breakdown voltage transistors are formed. As such, the impurity concentration of each well can be appropriately set according to the driving voltage and breakdown voltage of each transistor. The impurity concentration of the second well 30 and fourth well 40 is, for example, $4.0\times10^{16}$–$7.0\times10^{17}$ atoms/$cm^3$ in their surface concentration. The impurity concentration of the first well 20 and the third well 50 is, for example, $8.0\times10^{15}$–$4.0\times10^{16}$ atoms/$cm^3$ in their surface concentration.

With respect to the well depth, in view of the well breakdown voltage, the second well 30 and the fourth well 40 where low breakdown voltage transistors are located are formed shallower than the first well 20 and the third well 50 where high breakdown voltage transistors are formed. For example, the first well 20 has a depth of 10–20 $\mu$m, and the second well 30 and the fourth well 40 have a depth of 3–10 $\mu$m. As the depth of the first well 20 and the depth of the second well 30 and the fourth well 40 are compared, a depth ratio of the two is for example 2–5, respectively.

The transistors shown in FIG. 7 are isolated from one another by element isolation dielectric layers (not shown). Also, each of the high breakdown voltage transistors 300NH and 400PH may have a so-called offset gate structure in which the gate electrode does not overlap the source/drain layers. In an example described below, each high breakdown voltage transistor has a LOCOS offset structure. More specifically, in each of the high breakdown voltage transistors, an offset region is provided between a gate electrode and the source/drain layers. The offset region is composed of a low concentration impurity layer below the offset LOCOS layer that is provided in a specified region on the semiconductor substrate.

Figure 8:
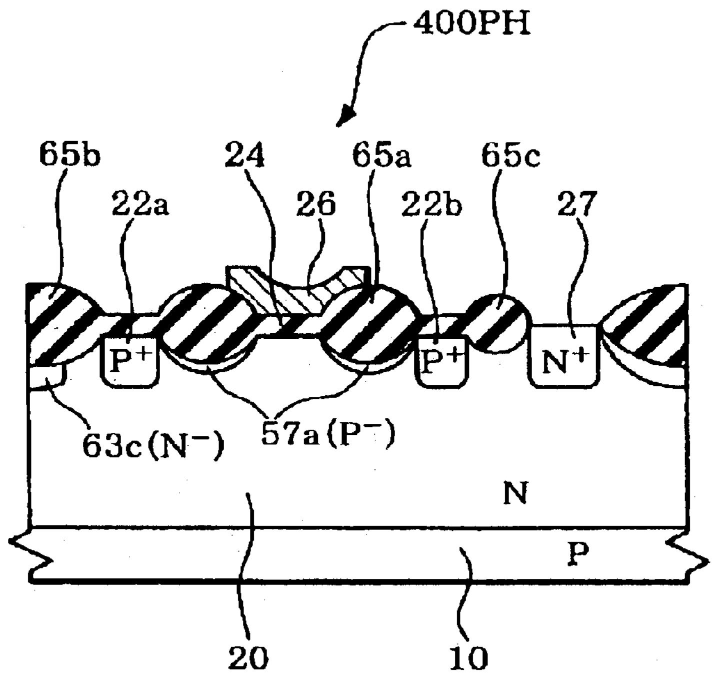
FIG. 8 shows a cross-sectional view of an exemplary structure of a high breakdown voltage transistor of a semiconductor device formed by a manufacturing method in accordance with an embodiment of the present invention.
Figure 9:
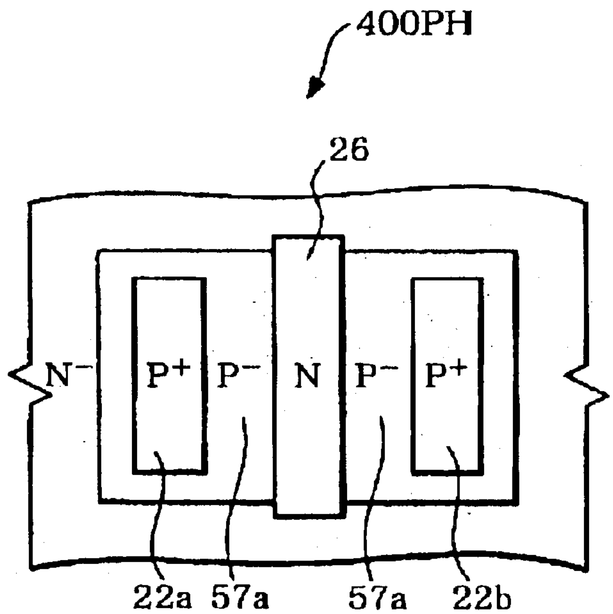
FIG. 9 shows a plan view of the main portions of the high breakdown voltage transistor shown in FIG. 8.

FIG. 8 shows, as an example of the offset gate structure, a cross-sectional view of the structure of the high breakdown voltage transistor 400PH. FIG. 9 shows a plan view of the main sections of the high breakdown voltage transistors 400PH.

The P-channel type high breakdown voltage transistor 400PH includes a gate dielectric layer 24 provided over the N-type first well 20, a gate electrode 26 formed over the gate dielectric layer 24, an offset LOCOS layer 65*a* provided around the gate dielectric layer 24, an offset impurity layer 57*a* composed of a P-type low concentration impurity layer that is formed below the offset LOCOS layer 65*a*, and source/drain layers 22*a* and 22*b* provided on the outside of the offset LOCOS layer 65*a*.

The high breakdown voltage transistor 400PH and its adjacent transistor are electrically isolated from each other by an element isolation LOCOS layer 65*b* (element isolation dielectric layer). Further, a channel stopper layer 63*c* composed of an N-type low concentration impurity layer is formed below the element isolation LOCOS layer 65*b* within the N-type first well 20 as shown in the drawing. A well contact layer 27 is isolated from the source/drain layer 22*b* by the LOCOS layer 65*c*. A channel stopper layer (not shown) can be formed below the LOCOS layer 65*c*.

Each of the high breakdown voltage transistors has a LOCOS offset structure and therefore has a high drain breakdown voltage, such that a high breakdown voltage MOSFET can be composed. In other words, by providing the offset impurity layer 57*a* composed of a low concentration impurity layer below the offset LOCOS layer 65*a*, the offset impurity layer 57*a* can be made relatively deep against the channel region, compared to a case without the offset LOCOS layer. As a result, when the transistor is in an OFF state, a deep depletion layer can be formed because of the offset impurity layer 57*a*, and a drain breakdown voltage can be increased as the electric field adjacent to the drain electrode is alleviated.

Figure 10:
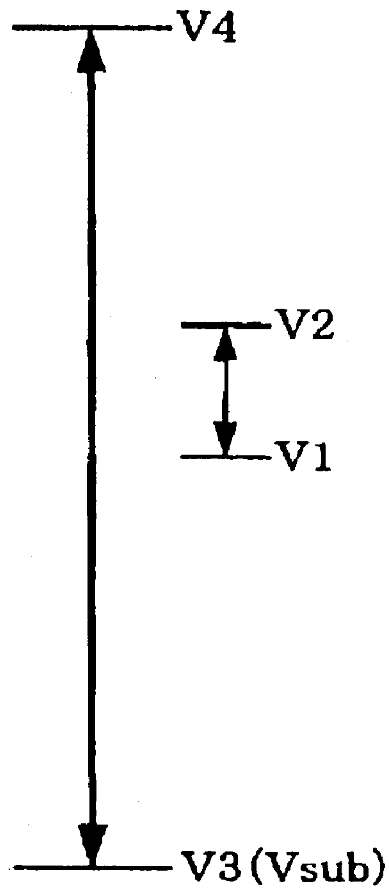
FIG. 10 shows the relations between driving voltages among the transistors in the semiconductor device in shown in FIG. 7.

Also, since the second well 30 and the fourth well 40 are formed within the first well 20, they are electrically isolated from the semiconductor substrate 10. As a result, bias conditions can be independently set for the second well 30 and the fourth well 40. In other words, driving voltages can be set for the second well 30 and the fourth well 40 independently of the substrate potential Vsub of the semiconductor substrate 10. Therefore, for example, as shown in FIG. 10, by setting driving voltages V1 and V2 for the low breakdown voltage transistors 100NL and 200PL intermediate between driving voltages V3 and V4 for the transistors 300NL and 400PL, a level shift circuit that converts a driving voltage level for a low breakdown voltage transistor to a driving voltage level for a high breakdown voltage transistor can be effectively and readily designed.

By the manufacturing method in accordance with the present invention, in step (C), because a heat treatment is conducted in an atmosphere that does not include oxygen, the semiconductor substrate 10 is not further oxidized. As a result, the silicon oxide layer 18 does not become thicker, and its film thickness can be retained. Accordingly, in step (D), the silicon oxide layer 18 can also be used as a protective film at the time of an ion implantation, and the number of steps can be reduced.

Normally, a heat treatment to diffuse impurities is conducted in the presence of oxygen. Therefore, an oxide film becomes thicker by the heat treatment, which renders it unsuitable for use as a protective film against an ion implantation. For this reason, as a general practice, such an oxide film is removed before ions are implanted, and a thermally oxidized film is formed anew on a surface of the semiconductor substrate. According to the manufacturing method of the present invention, the steps of removing an oxide film and forming a new oxide film can be eliminated, in contrast to such a process, and therefore the process can be simplified.

By the manufacturing method in accordance with the present embodiment, the first well 20 where the high breakdown voltage transistor 400PH is formed, and the second well 30 and the fourth well 40 where the low breakdown voltage transistors 100NL and 200PL are located are formed in different ion implantation steps and different drive-in steps with different heat treatments. Therefore the second well 30 and the fourth well 40 can be designed independently of the first well 20. As a result, the second well 30 and the fourth well 40 can be formed shallower to accommodate size-reduction and increased speeds of low breakdown voltage transistors, and also the area of the well can be reduced, such that the degree of integration of the second and third wells 30 and 40 can be improved to higher levels.

By the manufacturing method in accordance with the present embodiment, by the heat treatment in step (F), the P-type second well 30 and the N-type fourth well 40 can be simultaneously formed by diffusing the impurities in the impurity layer 30*a* and the impurity layer 40*a*. Also, by the manufacturing method in accordance with the present embodiment, by the heat treatment in step (C), the N-type first well 20 and the P-type third well 50 can be simultaneously formed by diffusing the impurities in the impurity layer 20*a* and the impurity layer 50*a*.

The present invention is not limited to the embodiment described above, and many modifications can be made within the scope of the subject matter of the present invention. For example, the embodiment described above shows an example in which the first conductivity type is P-type and the second conductivity type is N-type. However, these conductivity types may be reversed if desired. Also, the layer structure or plan structure of the semiconductor device can be different from those of the embodiment described above.

The entire disclosure of Japanese Patent Application No. 2002-061877 filed Mar. 7, 2002 is incorporated by reference.

What is claimed is:

1. A method for manufacturing a semiconductor device, the method comprising:

(a) introducing a first impurity of a second conductivity type by an ion implantation in a specified region of a semiconductor substrate of a first conductivity type;

(b) forming an oxide film on a surface of the semiconductor substrate, and diffusing the first impurity by a heat treatment in an atmosphere that does not include oxygen to form a first well of the second conductivity type; and (c) introducing a second impurity of the first conductivity type through the oxide film in a specified region of the first well, and diffusing the second impurity by a heat treatment to form a second well of the first conductivity type, wherein, in the stan (a), an anti-oxidation layer having a mask function against oxidation is selectively formed on the semiconductor substrate, and the first impurity is introduced in the semiconductor substrate using the anti-oxidation layer as a first mask.

2. A method for manufacturing a semiconductor device according to claim 1, wherein, in the step (a), a LOCOS layer is formed by selectively oxidizing a surface of the semiconductor substrate using the anti-oxidation layer as a mask; and after removing the anti-oxidation layer, an impurity of the second conductivity type is introduced in the semiconductor substrate using the LOCOS layer as a mask to form a third well in the semiconductor substrate adjacent to the first well.

3. A method for manufacturing a semiconductor device according to claim 1, wherein an impurity concentration of the second well is made higher than an impurity concentration of the first well.

4. A method for manufacturing a semiconductor device according to claim 2, wherein a fourth well of the second conductivity type is formed within the first well.

5. A method for manufacturing a semiconductor device according to claim 4, further comprising:

forming a low breakdown voltage transistor of the second conductivity type in the second well;

forming a low breakdown voltage transistor of the first conductivity type in the fourth well;

forming a high breakdown voltage transistor of the first conductivity type in the first well; and forming a high breakdown voltage transistor of the second conductivity type in the third well.

6. A method for manufacturing a semiconductor device according to claim 1, wherein a ratio of well depths of the first well with respect to the second well is about 2 to 5.

* * * * *